United States Patent [19]

Taylor

[11] Patent Number: 5,746,608
[45] Date of Patent: May 5, 1998

[54] SURFACE MOUNT SOCKET FOR AN ELECTRONIC PACKAGE, AND CONTACT FOR USE THEREWITH

[76] Inventor: Attalee S. Taylor, R.D. #1 Box 429G, Palmyra, Pa. 17078

[21] Appl. No.: 565,539

[22] Filed: Nov. 30, 1995

[51] Int. Cl.⁶ ............................................. H01R 9/09
[52] U.S. Cl. ............................................. 439/70; 439/83
[58] Field of Search ........................ 439/68, 70, 71, 439/83, 525

[56] References Cited

U.S. PATENT DOCUMENTS

| | | | |
|---|---|---|---|
| 4,447,109 | 5/1984 | Hobart, Jr. ........................ | 439/886 |
| 4,691,975 | 9/1987 | Fukunaga et al. ................ | 439/266 |
| 4,948,030 | 8/1990 | Chason et al. . | |
| 5,459,287 | 10/1995 | Swamy .............................. | 174/266 |
| 5,562,462 | 10/1996 | Matsuba et al. .................. | 439/70 |

FOREIGN PATENT DOCUMENTS

| | | | |
|---|---|---|---|
| 2 312 915 | 12/1976 | France ........................... | H05K 1/04 |
| 2 287 364 | 9/1995 | United Kingdom ............. | H01R 9/09 |

OTHER PUBLICATIONS

International Search Report: PCT/US 96/18206.

*Primary Examiner*—Neil Abrams
*Assistant Examiner*—Christopher Goins
*Attorney, Agent, or Firm*—Robert J. Kapalka

[57] ABSTRACT

A socket for an electronic package comprises a dielectric housing having contacts each with a surface mount section extending below a bottom surface of the housing for engagement with a respective circuit trace on a circuit board. The surface mount section of each contact has a convex bottom surface with a shape which simulates at least a lower surface portion of a solder ball, whereby the socket imitates the footprint of a ball grid array package. A contact having a convex bottom surface which simulates a solder ball is also disclosed

16 Claims, 5 Drawing Sheets

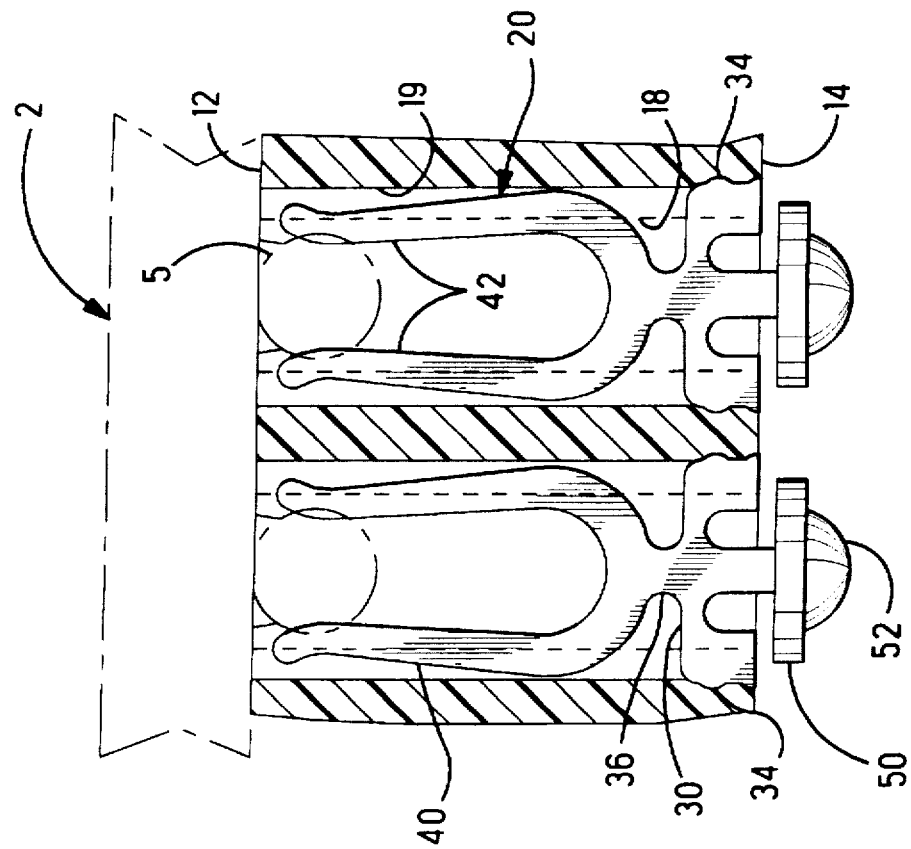
Fig. 4
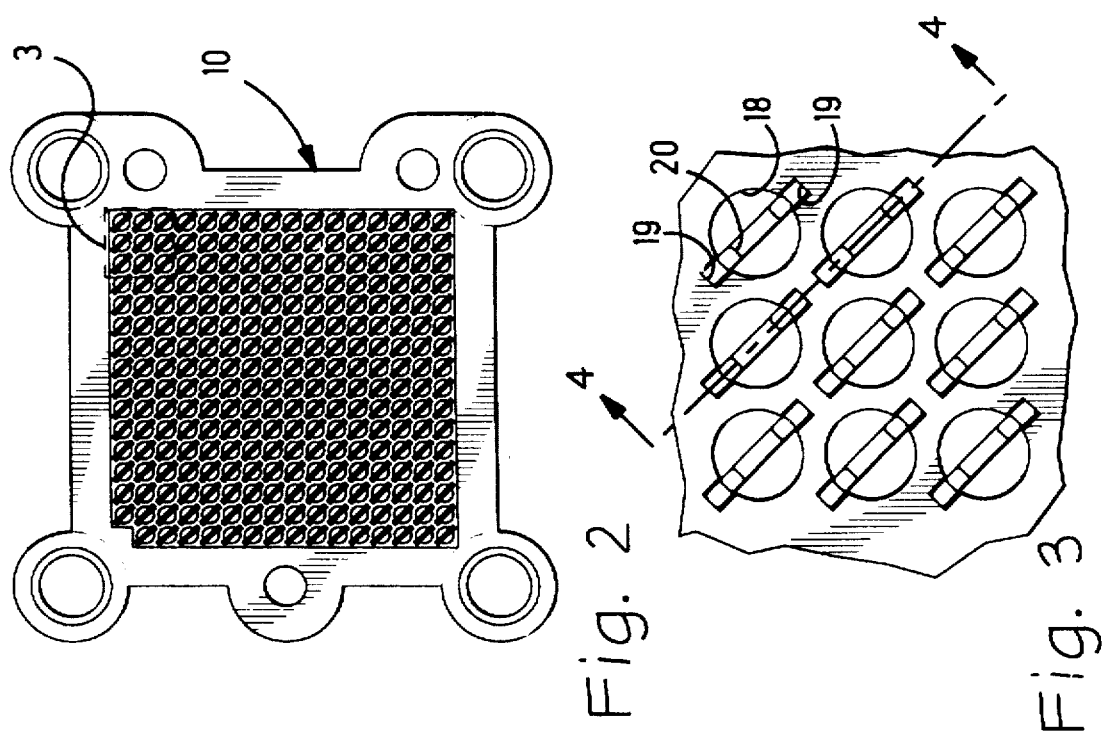
Fig. 2
Fig. 3

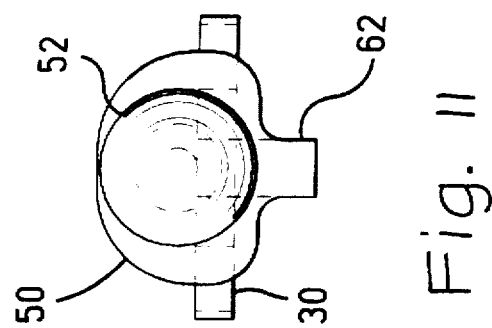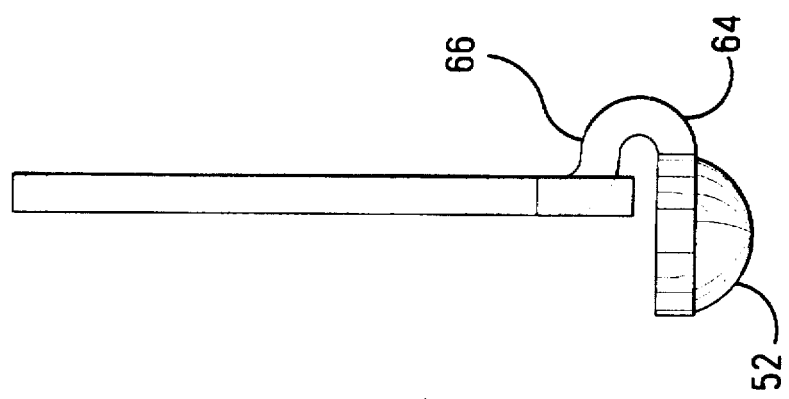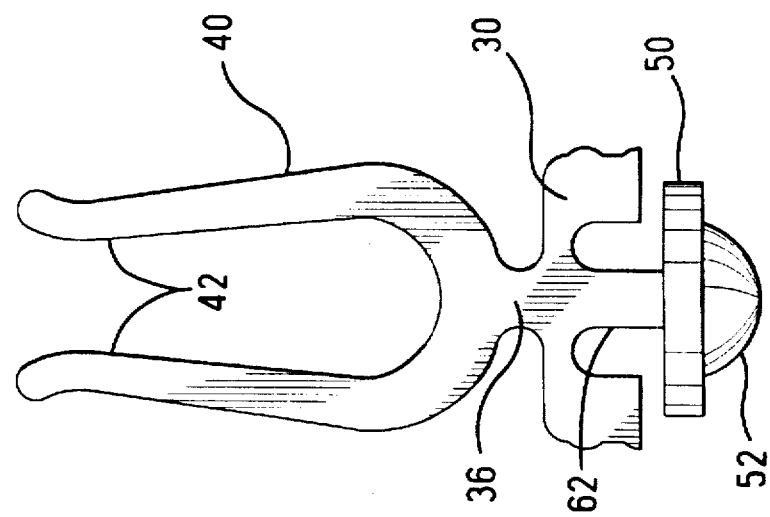

5,746,608

1

SURFACE MOUNT SOCKET FOR AN ELECTRONIC PACKAGE, AND CONTACT FOR USE THEREWITH

FIELD OF THE INVENTION

The invention relates to a socket having contacts each with a surface mount foot which imitates the shape of a solder ball on a ball grid array electronic package.

BACKGROUND OF THE INVENTION

A ball grid array (BGA) is a style of electronic package which is increasing in commercial importance. The BGA comprises an integrated circuit chip encased in a plastic or ceramic substrate and having solder ball leads disposed in an array over a bottom face of the substrate. The BGA can be attached directly to a circuit board by a solder reflow process wherein the leads are partially melted and then solidified to physically bond the leads to a corresponding array of pads on the circuit board. However, direct attachment makes removal of a defective BGA relatively difficult and expensive, and some manufacturers prefer to mount the BGA in a socket on the circuit board in order to simplify replacement or upgrade of the BGA. Benefits of the BGA package are that the leads can be arrayed on relatively close centerlines and that the solder balls have a greater tolerance for coplanarity deviations than alternative structures such as pads. It would be desirable to preserve these benefits when a socket is used to connect the BGA package to the board. Further, it would be desirable to obtain the above-described benefits of a BGA package with other electronic package styles, for example, a pin grid array (PGA) which has leads in the form of depending pins. In order to obtain the benefits of a BGA package, a socket should simulate the footprint of a BGA package as closely as possible.

SUMMARY OF THE INVENTION

It is an object of the invention to provide a socket which simulates the footprint of a ball grid array package.

It is another object of the invention to provide a socket having contacts which are specially adapted for surface mount connection to a circuit board.

These and other objects are provided by a socket which comprises a dielectric housing having a top surface for receiving an electronic package thereon, a bottom surface, a plurality of cavities extending between the top and bottom surfaces, and contacts disposed in respective ones of the cavities. Each of the contacts comprises an electrically conductive body having a retention section securable in its cavity, a lead-receiving section extending upwardly and engageable with a respective lead of the electronic package, and a surface mount section extending below the bottom surface and engageable with a respective circuit trace on a circuit board. The surface mount section has a convex bottom surface with a shape which simulates at least a lower surface portion of a spherical solder ball.

BRIEF DESCRIPTION OF THE DRAWINGS

The invention will now be described by way of example with reference to the accompanying drawings in which like elements in different figures thereof are identified by the same reference numeral and wherein.

2

FIG. 2 is a top plan view of a socket according to the invention.

FIG. 3 is an enlarged view of a portion of the socket within dashed lines in FIG. 2.

FIG. 4 is a cross-sectional view taken along line 4—4 of FIG. 3.

Figure 5:
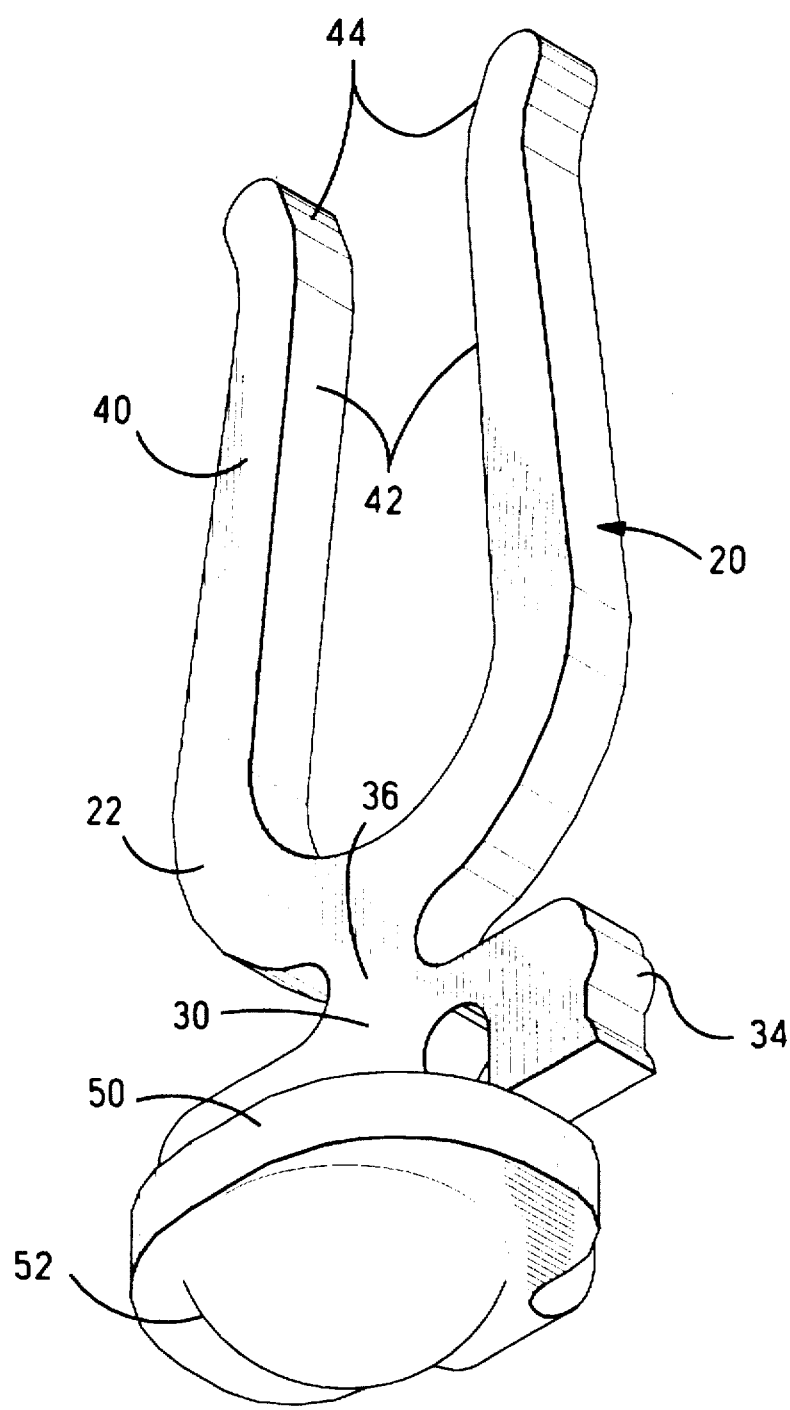
Figure 8:
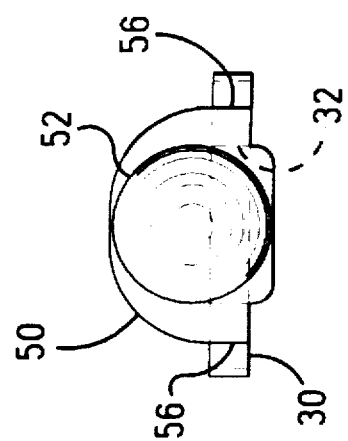
Figure 7:
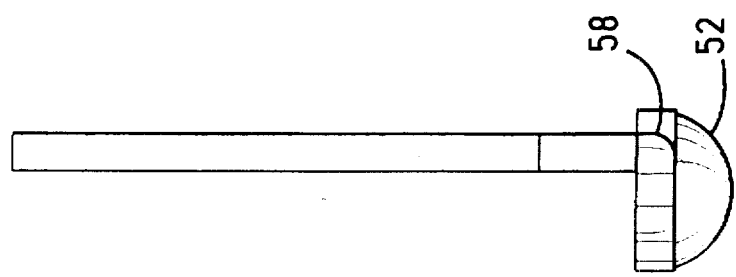
Figure 6:
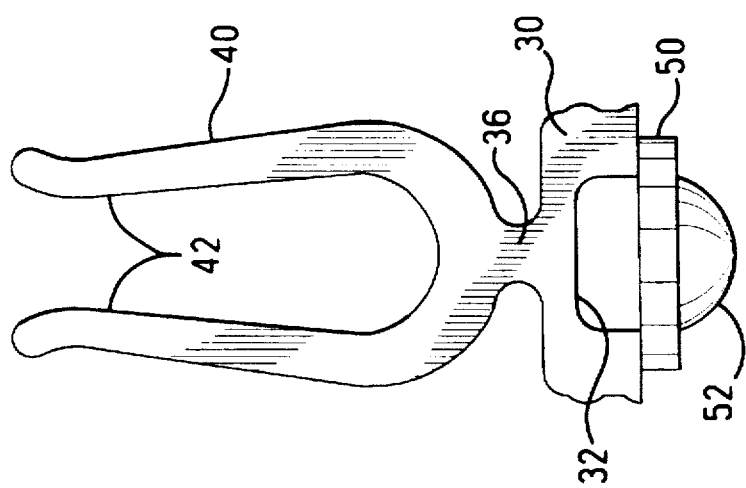

FIG. 5 is an isometric view of a contact according to the invention which can be used in the socket FIGS. 6–8 are front, side, and bottom views, respectively, of a contact according to the invention in one embodiment.

FIGS. 9–11 are front, side, and bottom views, respectively, of a contact according to the invention in an alternate embodiment.

BRIEF DESCRIPTION OF THE PREFERRED EMBODIMENT

Figure 1:
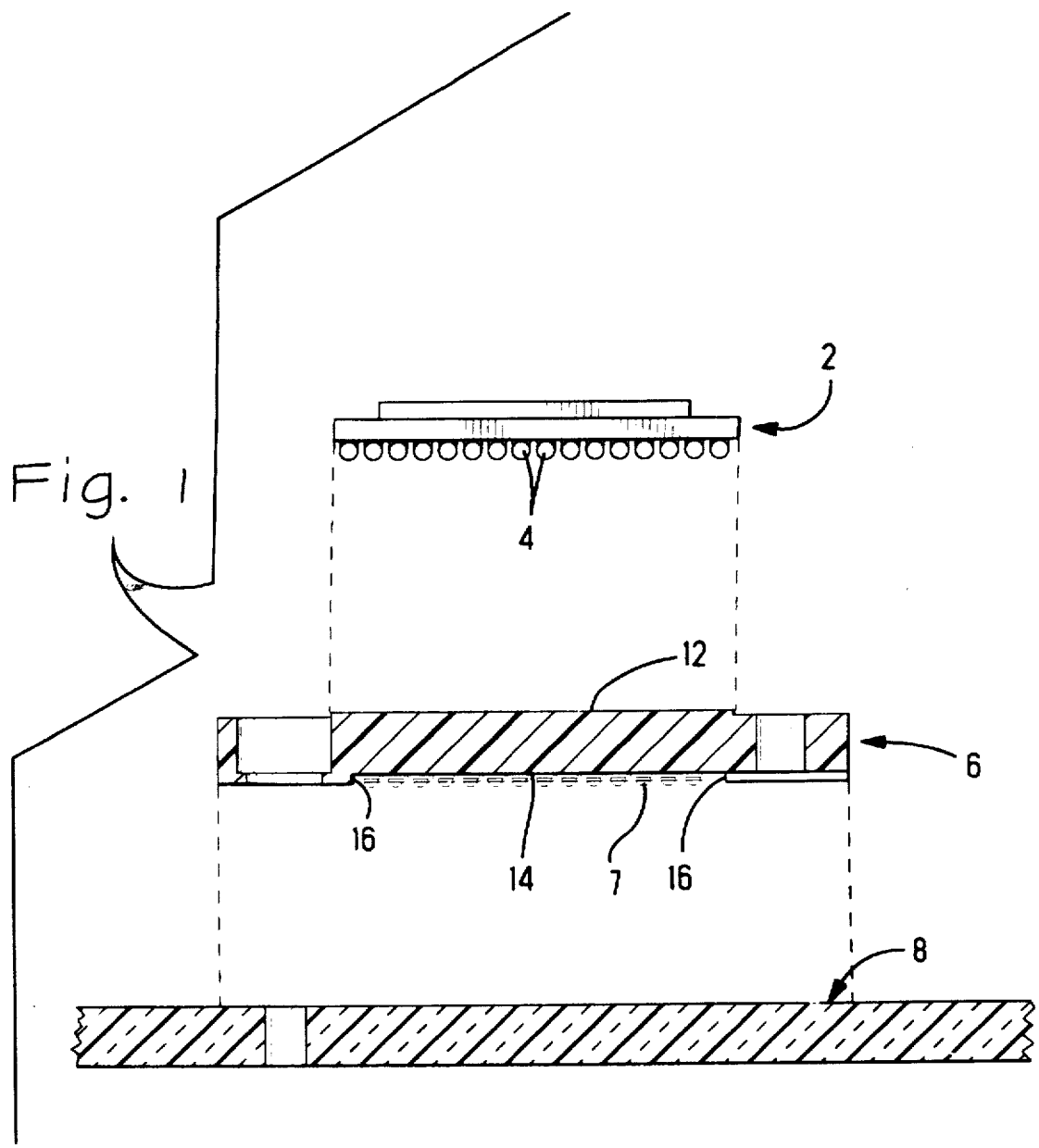
FIG. 1 is an exploded elevation view of a socket according to the invention disposed between an electronic package and a circuit board with which it can be used.

With reference to FIG. 1, a socket 6 according to the invention is useful for interconnecting an electronic package 2 to a circuit board 8. The electronic package 2 with which the invention can be used is of the type which has a plurality of leads 4 arranged in an array and depending from a bottom surface thereof. Commercial varieties of the package 2 include a ball grid array (BGA) package wherein the leads 4 are in the form of solder balls, and a pin grid array (PGA) package wherein the leads are in the form of elongated pins.

The socket 6 includes a dielectric housing 10 having a top surface 12 which receives the electronic package thereon, and a bottom surface 14 which is arranged to confront the circuit board 8. The housing 10 may have pedestals 16 which elevate the bottom surface 14 a small distance above the circuit board 8 in order to prevent crushing of surface mount leads 7 of contacts in the socket when the socket is clamped to the circuit board such as with threaded fasteners. Alternatively, the socket may be produced without the pedestals 16.

As shown in FIGS. 2, 3 and 4, the housing 10 has a plurality of cavities 18 which are arranged in an array corresponding to the array of leads of the electronic package 2. Each of the cavities 18 includes a pair of diametrically opposed slots or channels 19. The cavities 18 and the channels 19 extend through the housing between the top surface 12 and the bottom surface 14. Each of the cavities 18 holds a respective contact 20 in the opposed channels 19.

With reference to FIGS. 4 and 5, a contact 20 according to the invention includes an electrically conductive body 22 which is preferably stamped and formed from a planar strip of material such as a copper alloy. The body 22 includes a retention section 30, a lead-receiving section 40, and a surface mount section 50. The retention section 30 is configured to be secured within one of the cavities in the housing, for example, with irregular or barbed ends 34 which grip the diametrically opposed walls of the channels 19. A narrow compliant section 36 permits some angular flexation of the lead-receiving section 40 with respect to the retention section 30.

The lead-receiving section 40 is engageable with a lead of the electronic package. A preferred configuration for the lead-receiving section 40 includes a pair of spaced apart arms 42. The arms 42 flare divergently at their free ends 44 to facilitate entry of one of the leads 4 into a region between the arms. The arms are deflected apart upon insertion of the lead, whereby deflection forces generated in the arms act to resiliently capture the lead therebetween.

As shown in FIG. 4, a lead in the form of a solder ball 5 is captured between the arms 42 in the approximate region where the arms are closest together. Since the arms resiliently deflect, solder balls which vary slightly in diameter may be accommodated. Deflection forces exerted by the arms 42 cause the arms to deform the surface of the solder ball and embed themselves in the surface, thereby facilitating a good electrical connection.

In order to accommodate a pin lead of a PGA package, the arms 42 could be arranged at a spaced apart distance selected to provide a desired normal force on the pin when the arms are deflected apart by the pin. The lead-receiving section could also be provided in other configurations which would provide a reliable electrical connection with the pin.

The surface mount section 50 has a convex bottom surface 52 with a shape which simulates at least a lower surface portion of a sphere. In this way, the convex bottom surface 52 mimics at least a bottom surface portion of a spherical solder ball. The convex bottom surface 52 can be formed progressively by stamping a material strip with a-series of dies of progressively greater dimension. The convex shape makes the bottom surface well-suited for surface mount soldering to a circuit board. In order to facilitate surface mount soldering, the convex bottom surface may have a tin, tin-lead, or solder plating.

In one embodiment of the contact as shown in FIGS. 6, 7 and 8, the retention section 30 has an aperture 32 and the surface mount section 50 is connected to the retention section by a pair of struts 56 which are formed with a substantially right angle bend 58. The bend 58 extends the surface mount section substantially perpendicular to the plane of the body 10 so that the convex bottom surface 52 is oriented for engagement with a pad on the circuit board when the contact 20 is installed in the socket housing.

In another embodiment of the contact as shown in FIGS. 9, 10 and 11, the surface mount section 50 is connected to the retention section 30 by a single strut 62 which is formed with a right angle bend 64 and with a reverse bend 66. The bends 64 and 66 cooperate to increase compliancy between the retention section 30 and the surface mount section 50, thereby enabling a socket having these contacts to better accommodate coplanarity deviations between the bottom surfaces 52 and the circuit board pads, and to better handle thermal expansion mismatches between the socket and the circuit board.

A socket according to the invention several advantages. The socket has the same circuit board footprint as an actual ball grid array package, and obtains many of the same advantages such as reduced coplanarity requirements The simulated solder balls of the contacts are easier to solder than other surface mount lead designs, and the same process can be used to solder either the socket or a BGA package to the board.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

I claim:

1. A socket for interconnecting an electronic package to a circuit board, comprising:

a dielectric housing having a top surface for receiving the electronic package thereon, a bottom surface, and a plurality of cavities extending between the top and bottom surfaces;

contacts disposed in respective ones of the cavities, each of the contacts comprising body electrically conductive body which is stamped and formed from a material strip, the body having a retention section securable in its said cavity, a lead-receiving section extending upwardly and engageable with a respective lead of the electronic package, and a surface mount section extending below the bottom surface and engageable with a respective circuit trace on the circuit board, the surface mount section having a convex bottom surface which is formed by stamping a portion of the material strip into a shape which mimics at least a lower surface portion of a sphere.

2. The socket according to claim 1, wherein each said lead-receiving section includes a pair of spaced apart arms arranged to resiliently capture said respective lead therebetween.

3. The socket according to claim 1, wherein each said body includes a compliant section between the lead-receiving section and the retention section for permitting relative angular deflection therebetween.

4. The socket according to claim 1, wherein each said contact has a tin-lead plating on the convex bottom surface thereof.

5. A contact for use in a socket for interconnecting an electronic package to a circuit board, the contact comprising:

an electrically conductive body which is stamped and formed from a material strip, the body having a retention section securable in a cavity in the socket, a lead-receiving section engageable with a lead of the electronic package, and a surface mount section engageable with a circuit trace on the circuit board, the surface mount section having a convex bottom surface which is formed by stamping a portion of the material strip into a shape which mimics at least a lower surface portion of a sphere.

6. The contact according to claim 5, wherein the body has a right angle bend between the retention section and the surface mount section.

7. The contact according to claim 6, wherein the body has a reverse bend which cooperates with the right angle bend to increase compliancy between the retention section and the surface mount section.

8. The contact according to claim 5, wherein the lead-receiving section includes a pair of spaced apart arms arranged to resiliently capture the lead therebetween.

9. The contact according to claim 5, wherein the body includes a compliant section between the lead-receiving section and the retention section for permitting relative angular flexation therebetween.

10. The contact according to claim 5, further comprising a tin-lead plating on the convex bottom surface.

11. A contact for use in a socket for interconnecting an electronic package to a circuit board, the contact comprising:

an electrically conductive body which is stamped and formed from a material strip, the body having a retention section securable in a cavity in the socket, a lead-receiving section engageable with a lead of the electronic package, and a surface mount section engageable with a circuit trace on the circuit board, the surface mount section having a convex bottom surface which is formed by stamping a portion of the material strip into a shape which simulates at least a bottom surface portion of a solder ball.

12. The contact according to claim 11, wherein the body has a right angle bend between the retention section and the surface mount section.

13. The contact according to claim 12, wherein the body has a reverse bend which cooperates with the right angle bend to increase compliancy between the retention section and the surface mount section.

14. The contact according to claim 11, wherein the lead-receiving section includes a pair of spaced apart arms arranged to resiliently capture the lead therebetween.

15. The contact according to claim 11, wherein the body includes a compliant section between the lead-receiving section and the retention section for permitting relative angular flexation therebetween.

16. The contact according to claim 11, further comprising a tin-lead plating on the convex bottom surface.

* * * * *